(12) United States Patent
Ito

(10) Patent No.: US 6,632,512 B1
(45) Date of Patent: Oct. 14, 2003

(54) CERAMIC SUBSTRATE

(75) Inventor: Yasutaka Ito, Ibi-gun (JP)

(73) Assignee: Ibiden Co., Ltd., Ibi-gun (JP)

( * ) Notice: Subject to any disclaimer, the term of this patent is extended or adjusted under 35 U.S.C. 154(b) by 0 days.

(21) Appl. No.: 09/787,954

(22) PCT Filed: Feb. 15, 2000

(86) PCT No.: PCT/JP00/00817

§ 371 (c)(1),
(2), (4) Date: Mar. 23, 2001

(87) PCT Pub. No.: WO01/35459

PCT Pub. Date: May 17, 2001

(30) Foreign Application Priority Data

Nov. 10, 1999 (JP) ............................................. 11-320010
Dec. 9, 1999 (JP) ............................................. 11-349692

(51) Int. Cl.$^7$ ................................................ B32B 3/00
(52) U.S. Cl. ...................... 428/210; 174/252; 174/261; 174/262; 174/266
(58) Field of Search .......................... 428/210; 174/252, 174/261, 262, 266

(56) References Cited

U.S. PATENT DOCUMENTS

| | | | |
|---|---|---|---|
| 3,346,689 A | * | 10/1967 | Parstorfer |
| 6,031,729 A | * | 2/2000 | Berkely et al. ............. 361/771 |
| 6,103,978 A | * | 8/2000 | Amir ........................... 174/255 |
| 6,255,601 B1 | * | 7/2001 | Burkhart ..................... 174/262 |
| 6,303,879 B1 | * | 10/2001 | Burkhart ..................... 174/261 |

FOREIGN PATENT DOCUMENTS

| | | |
|---|---|---|
| JP | 57-182893 | 11/1982 |
| JP | SHO57-182893 | 11/1982 |
| JP | SHO62-130544 | 6/1987 |
| JP | 09-213455 | 8/1987 |
| JP | 62264638 | 11/1987 |
| JP | 06-177231 | 6/1994 |
| JP | 06-204385 | 7/1994 |

* cited by examiner

Primary Examiner—Cathy Lam
(74) Attorney, Agent, or Firm—Oliff & Berridge, PLC

(57) ABSTRACT

The present invention provides a ceramic substrate for use in an apparatus for manufacturing and inspecting semiconductors. The ceramic substrate comprises a through-hole having excellent tolerance performance against a drawing stress applied to an external terminal pin. The through-hole is provided with a projection which protrudes into the ceramic substrate made of aluminum nitride as primary component.

4 Claims, 9 Drawing Sheets

(a)

(b)

(c)

Picture substitution for figure

CERAMIC SUBSTRATE

TECHNICAL FIELD

The present invention relates to a ceramic substrate for use in the semiconductor industrial field, and more particularly, it relates to a ceramic substrate for use in a wafer prober, an electrostatic chuck, a hot plate and the like, for use in the manufacture or inspection processes of semiconductors.

BACKGROUND ART

Applied semiconductor products are indispensable in many industrial fields. As a typical example, semiconductor chips are manufactured by slicing a silicon monocrystalline to a predetermined thickness to produce a silicon wafer; then forming a variety of circuits in a pattern shape thereon.

In order to manufacture a semiconductor chip, an electrostatic chuck for supporting a wafer, a hot plate for heating a wafer, and a wafer prober for checking whether the circuit operates in accordance with its design are needed. These may preferably be of ceramic material in terms of heat resistance and corrosion resistance.

For example, Japanese patent registration No. 2798570 discloses an electrostatic chuck made of ceramic materials having such construction as to have a heat generation body therein.

FIG. 11 is a cross sectional view showing an example of such electrostatic chuck schematically. The electrostatic chuck shown in the figure is provided therein with a RF electrode 80 and a heat generation body 82. Furthermore, the electrostatic chuck is provided therein with through-holes 84, 86 for connection respectively with the RF electrode 80 and the heat generation body 82. In fact, respective through-holes 84, 86 are formed by a sintered ceramic body of a laminated structure, which have a cylindrical shape, and being filled with conductive components. As the conductive materials, for example, tungsten is adopted. The structure of the through-holes of the electrostatic chuck are such that the electric wiring of respective layers are drawn out and/or connected to each other via an external terminal pins 88.

Accordingly, the through-holes 84, 86 are made of different materials from a sintered ceramic material from the view point of structural metallography. Additionally, a thermal expansion rate of the through-holes 84, 86 is different from that of a sintered ceramic materials. Accordingly, adhesion between tungsten and sintered ceramic materials tends to deteriorated.

Due to a long-term use, if a heat sink cycle and a thermal shock are applied to such electrostatic chuck, adhesion between the through-hole and a sintered ceramic material deteriorates. The external terminal pin is connected using a flux. The structure arises a problem such that the repeated attachment and detachment between the external terminal pin and a power supply causes a drawing force to be applied to the through-hole, thus resulting that adhesion between a through-hole and a sintered ceramic material to be deteriorated.

Such problem is not always brought to an electrostatic chuck, but also to a wafer prober having a ceramic substrate provided with electrodes therein and to a ceramic heater having a ceramic substrate provided with a heat generation body therein.

The object of the present invention is to provide a ceramic substrate which is provided with a through-hole having an excellent tolerance against a drawing stress applied to an external terminal pin, the ceramic substrate being for use in an inspection device for use in processes of manufacturing semiconductors.

DISCLOSURE OF INVENTION

The present invention has been made in view of the above circumstances and has an object to overcome the above problems and to provide a ceramic substrate, which comprises a conductor layer on the surface or inside of the ceramic substrate, and a through-hole connected electrically to the conductor layer, wherein a projection is formed on a side wall of the through-hole so as to protrude into said ceramic substrate.

The ceramic substrate for use in an inspection device for use in processes of manufacturing semiconductors has a projection which protrudes into the ceramic substrate, thus allowing remarkable increasing of the adhesion area between the conductor materials for use in forming through-holes and the ceramic substrate. Furthermore, the projection has an anchor effect, thus allowing adhesion between them to be increased. Accordingly, such adhesion allows the ceramic substrate of the present invention to have an excellent tolerance against a drawing stress applied to an external terminal pin fixed to the through-hole's end face.

In this case, the conductor layer may satisfactorily be formed on the surface and the through-hole which is electrically connected to the conductor layer may satisfactorily be formed on the ceramic substrate. Thereby, the ceramic substrate may be made to function as a wafer prober.

Alternatively, the ceramic substrate may be made to function as a heater if a heat generation means is formed as a conductor layer inside the ceramic substrate, and if the through-hole being connected to the conductor layer is formed on the ceramic substrate, furthermore, a projection is formed on a side wall of the through-hole so that the projection may protrude into the ceramic substrate.

In accordance with the ceramic substrate having above identified structure, the projection (or protrusion) from the through-hole which functions as a heat conduction radiates heat, thus allowing uniformity of heating over the entire ceramic substrate to be improved. If a through-hole with no projection is connected to a heat generation body then a heat conductivity of a ceramic material under a high temperature may decrease, thus resulting a heat concentration on the through-hole. This part becomes a specific point (a hot spot) which is a cause of a damage of a semiconductor wafer. In contrast, according to the present invention, there is no heat concentration on a through-hole because the projection of the ceramic substrate also functions as a cool-down fin. Such ceramic substrate can be incorporated into devices which needs the heat controls, such as a wafer prober or an electrostatic chuck. The ceramic substrate may be used under a temperature from 150 to 1800° C. depending on its application.

Alternatively, an electrostatic electrode as a conductor layer may be provided for inside of the ceramic substrate, and through-hole being connected electrically to the electrostatic electrode may be formed on the ceramic substrate, then a projection may be formed on a side wall of the through-hole so that the projection may protrude into the ceramic substrate. Thereby, the ceramic substrate may be made to function as an electrostatic chuck. Where, "an electrostatic chuck" is an electrode which attracts a semiconductor wafer by means of an electrostatic force under voltage.

As the material used for "the ceramic substrate" according to this invention, a sintered substrate of aluminium nitride may be preferable. The material used for the ceramic substrate is not limited to aluminium nitride. For example, other ceramic materials may also be equally used instead, such as carbide ceramics, oxide ceramics, nitride ceramics except aluminium nitride and the like.

Some examples of "carbide ceramics" include, by way of examples not limitative, metal carbide ceramic material such as silicon carbide, zirconium carbide, titanium carbide, tantalum carbide, tungsten carbide and the like. Some examples of "oxide ceramics" include, by way of examples not limitative, metal oxide ceramic material such as alumina, zirconia, cordierite, mullite and the like. Some examples of "nitride ceramics" include, by way of examples not limitative, the metal nitride ceramic material such as silicon nitride, boron nitride, titanium nitride and the like, other than the aluminium nitride as described above. Among these ceramic materials, in general, nitride ceramics and carbide ceramics are preferred to oxide ceramics because of their heat conductivity. The sintered bodies may be of a single material or of a plurality of materials.

BEST MODE FOR CARRYING OUT THE INVENTION

Hereinafter, each of preferred embodiments of the present invention will be described in greater details referring to drawings. In following description, although the description is made concerning a wafer prober as an example, it is not to mention that the present invention can be applied to a hot plate and an electrostatic chuck.

Figure 1:
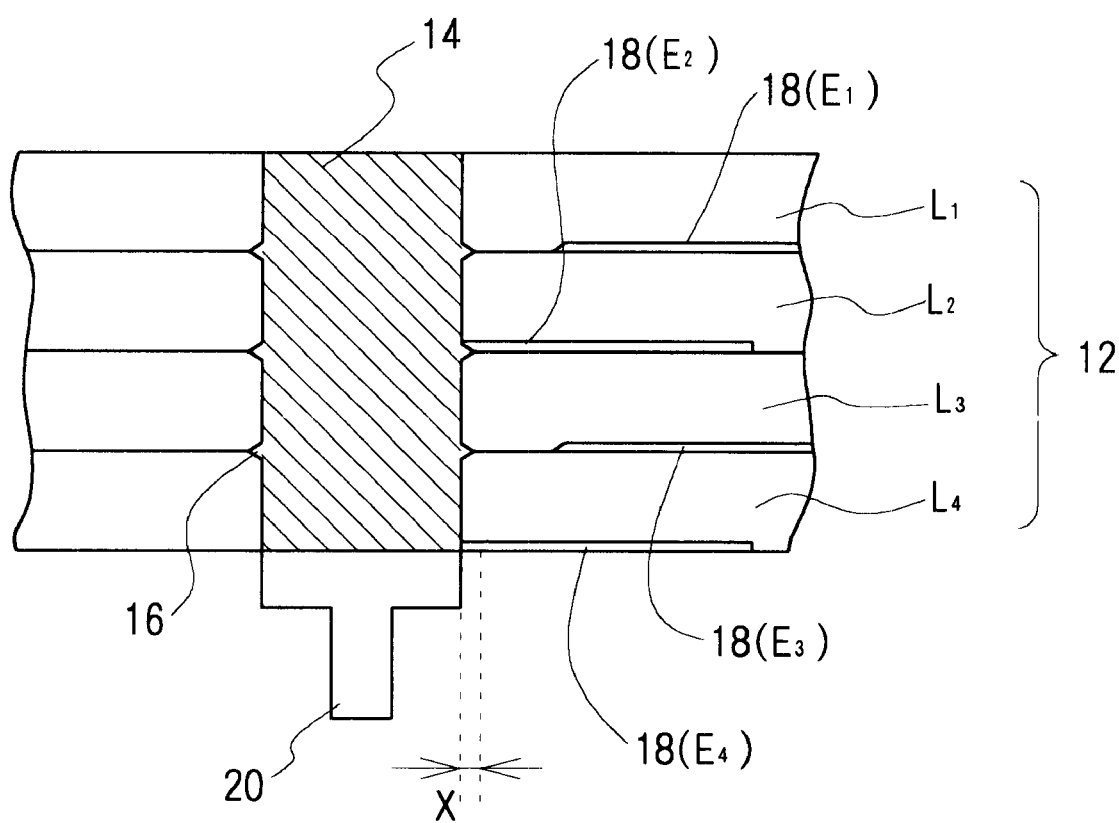
FIG. 1 is a view showing a cross sectional structure of the ceramic substrate, according to one embodiment of the present invention.

FIG. 1 shows a part of a cross sectional structure of a sintered substrate made of aluminium nitride with a through-hole 14 as a center(hereinafter referred to as "a ceramic substrate 12"), which is a base substrate of a wafer prober 10.

As shown in FIG. 1, the wafer prober 10 is composed of the ceramic substrate 12 having a multiple laminated structure. The ceramic substrate 12 is made of alminium nitride material which is provided with the through-hole 14 at an appropriate position, the through-hole 14 being for connection with an external terminal pin. The through-hole 14 has projections 16 on its outer circumference of a side wall, from which the projections 16 projects radially into the ceramic substrate 12. The through-hole 14 can be of any shape from the side view, such as a cylinder, a plate, a screw, or the like. From the axial view, it can be of any shape such as a circle, a polygon, or the like.

Reference numerals E1 to E4 denote conductor layers 18 which functions as an electrode E. The conductor layers 18 are formed on respective layers L1 to L4 of the ceramic substrate 12 made of aluminium nitride having a laminated structure. Respective conductor layers 18 and the like are connected to the through-hole 14 appropriately. Herein, respective conductor layers 18 and the like mean a guard electrode E and a ground electrode E formed on respective layers L1 to L4 of the ceramic substrate 12, in addition to this, a general circuit elements, an electric conductor, a resistive body, a semiconductor, such as a heat generation body 34, an electrostatic electrode 36, and the like. Number of lamination are commonly defined as two or more by means of such wiring structure that realizes the electric performance needed for the wafer prober 10.

The projection 16 which projects into the ceramic substrate 12 encroaches on the ceramic substrate 12 (a bite structure), therefore a contact area between the material filled in the through-hole 14 and the ceramic substrate 12 increases greatly, thus adhesion therebetween is made to be improved. Accordingly, the ceramic substrate 12 has such through-hole structure that has a high reliability and an lo excellent tolerance against a drawing stress applied to an external terminal pin 20.

Next, the description is made in case that the conductor layer 18 is used as a heat generation body. If the projection 16 is connected to a heat generation body built-in the ceramic substrate 12, then it is not occurred that a heat concentration to the through-hole 14 due to down of a heat conductivity of the ceramic substrate 12, even when a temperature rises above or equal to 200° C. Accordingly, the specific point (a hot spot) is not formed on a heating surface. Because the projection 16 releases heat, that is formed on a side wall of an outer circumference of the through-hole 14.

Figure 2:
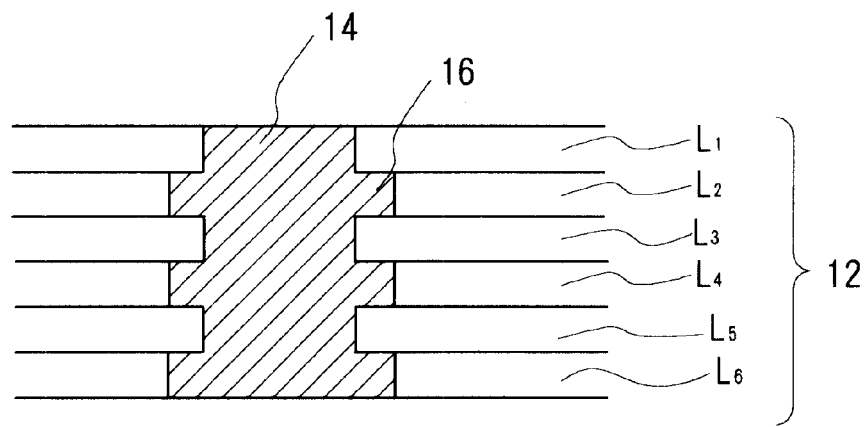
FIG. 2 is a view showing a cross sectional structure of the ceramic substrate, according to another embodiment of the present invention.
Figure 3:
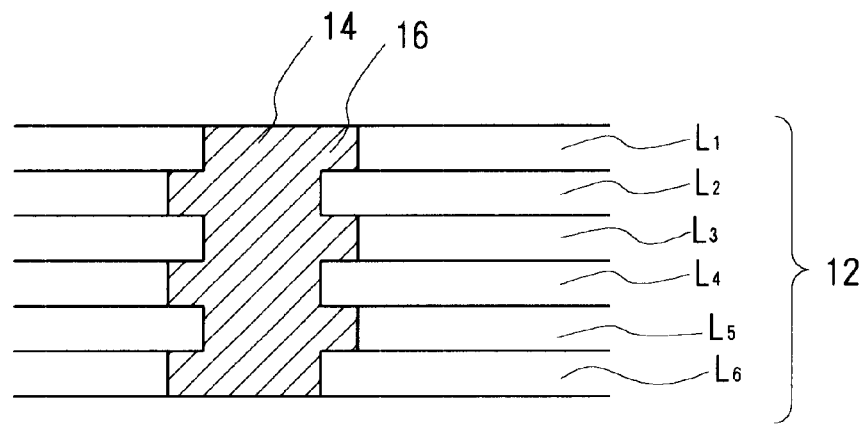
FIG. 3 is a view showing a cross sectional structure of the ceramic substrate, according to another embodiment of the present invention.

A shape of "the bite structure" changes to some extent due to variation of setting of each process in a method of manufacturing processes described below. Each projection 16 may satisfactorily be formed on a boundary between respective layers in the laminated structure on the through-hole 14 having a cylindrical shape or a plate shape, so that its shape of the projection 16 may be of a shape of a brim or a bamboo joint (see FIG. 2 or FIG. 3). In this case, the shape of a brim or a bamboo joint is not necessarily a continuous shape along an outer circumference of a cylindrical shape or a plate shape. A size X (see FIG. 1) of the projection 16 is determined based on the mutual relation with adjacent through-hole 14. The size X is determined within a range of 50 μm to 0.5 mm in respect with the general through-hole 14 having a diameter within a range of 20 μm to 10 mm.

The reason why this range is adopted is as follows: if expansion of size X of the projection 16 is too large, then such possibility becomes high that dielectric breakdown occurs between the projection 16 and adjacent through-hole 14; and/or a heat concentration to the projection 16 causes temperature not to be uniform. If the projection 16 is too small, then there is no effect due to heat dissipation.

The projection 16 is formed on the lamination boundary between each laminated green sheet body before firing. Because the ceramic substrate 12 is made of a sintered material of a laminated green sheet body. By using general process for molding a green sheet, the number of the projection 16 corresponding to the number of laminated sheets can be formed. Accordingly, the projection 16 can be formed in the ceramic substrate 12 without using a special facilities and/or a complex method.

Figure 4:
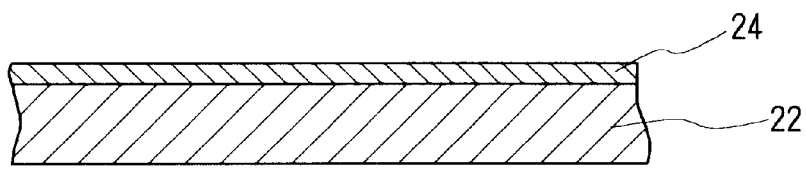
FIGS. 4(a) to 4(c) show manufacturing processes of forming a punch hole for a through-hole, according to one embodiment of the present invention.
Figure 4:
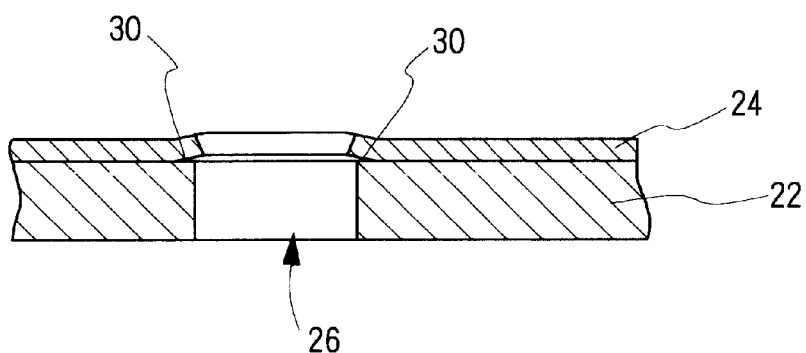
Figure 4:
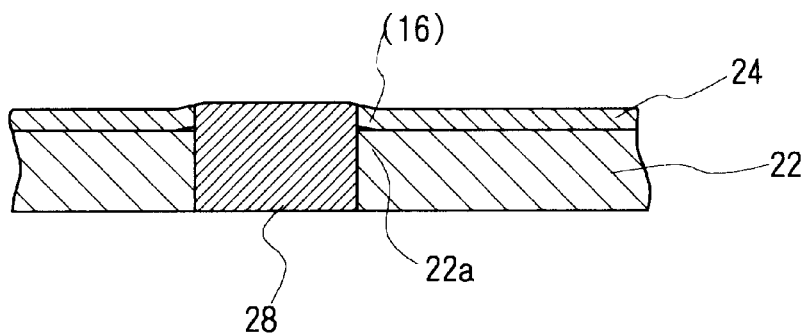

Next, referring to FIG. 4, the method for manufacturing the ceramic substrate 12 having the through-hole 14 provided with the projection 16 will be described. In the foregoing description, the different point from the conventional sheet forming method will be described in detail, and the point which is not described is similar to the conventional sheet forming method. In the present embodiment, a sintered substrate of aluminium nitride is prepared by using above-described sheet forming method.

FIGS. 4(a) to 4(c) show processes of forming a punch hole according to one embodiment of the present invention. Firstly, as shown in FIG. 4(a), the green sheet 22 employed for the series of processes has such major plane that is adhered to and covered with a base film 24, similar to the conventional sheet. Then a plurality of the green sheets 24 is prepared for the numbers of lamination; a punching hole 26 is formed by punching hole in each green sheet for forming the through-hole 14 (FIG. 2(b)); the punching hole 26 is filled with conductive material 28; then each green sheet 24 is laminated and sintered. In this embodiment, a gap 30 is formed at a periphery part 22a around the punching hole 26 by a process of stripping partially the green sheet 22 from the base film 24; then the punching hole 26 is filled with the conductive material 28 for use in a through-hole, and the gap 30 is also filled with the conductive material 28; thereby the projection 16 is formed by the conductive material 28 filled in the gap 30.

Particularly in a point of forming the gap 30, a detail description will be made concerning a method for manufacturing the green sheet on which the above-mentioned gap 30 can be formed. In general, for the production of green sheets, a predetermined amount of binder, solvent, sintering agent and the like are added to the powdered aluminium nitride material, in accordance with the predetermined composition; then the obtained mixture is put into a ball mill and the like to mull for a predetermined period of time to prepare a slurry. Well-known materials may be used as powdered aluminium nitride and sintering agent.

The slurry are molded into the green sheets 22 having a predetermined size and shape, in accordance with the method already established for forming shaped-sheets, such as the doctor blade method. Method for producing a thin layer of sheets is not limited to the doctor blade method, and it may be a shaping method with a flat-rolling process. To mold into the green sheet 22 by way of the doctor blade method, a doctor blade machine may be used that incorporates a doctor blade, base films and a drying kiln.

For the binder for the green sheets 22, at least one selected from a group consisted of acrylic resin, ethyl cellulose, butylcellosorb and polyvinyl alcohol is preferred. For the solvent, at least one selected from a group consisted of α-terpineol and glycol is preferred. The base material of the base film is polyethylene terephthalate (PET), and the base film is surface-finished so as to be flat, smooth and mold-releasable in order to assure that the green sheets are formed at a constant thickness.

Caused by the surface-finishing, after drying, the green sheet 22 formed on the base film 24 is adhered to the base film, remaining such a degree that the green sheet 22 and the base film 24 can be treated in a body. Once stripping them off, adhesion falls to such a degree it can adhere with difficulty.

In the mean time, the slurry are once stored in a wet storage in the doctor blade machine; the slurry, shaped in a thin film, are pulled out of the gap between the doctor blade machine and the base film 24 along with the transfer of the base film 24 being taken-up by a winder (not shown). Thickness of the slurry may be adjusted by the gap, thereby a predetermined amount of the slurry are quantitatively rolled out on the base film 24; then the resulting slurry, together with the base film 24, are transferred to the drier kiln. Thickness of the green sheet 22 may be preferably in the range of 0.1 mm to 5 mm.

In the drier kiln, the volatile component in solvent contained in the slurry and the like will evaporate and the sheet will be dried and become in a form of a thin film resin, thereby the green sheet 22 on which the base film 24 is formed can be obtained as shown in FIG. 4(a). The green sheet 22 is once taken-up by the winder, remaining that the green sheet 22 being adhered to the base film 24 as it is.

After that the green sheet 22 to which the base film 24 is adhered is rewound and spread to be a plane; then the punching hole 26 is formed as a cavity at the predetermined position on the green sheet 22 by punching it together with the base film 24 (see FIG. 4(b)).

When punching hole, the green sheet 22 is punched by means of a punching machine (not shown) which causes the green sheet 22 to pass through a die with being put between the upper and lower punches; a punching speed is set so that an edge of the base film 24 may be slightly peeled off from an edge of the green sheet 22 to form the gap 30; under the condition, punching process is executed. Punching speed may preferably be within a range of 1 m/second to 10 m/second because of easiness of forming the gap 30 and no outbreak of the punching reaction.

Once the gap 30 is formed, then adhesiveness around the gap 30 between the green sheet and the upper/lower films falls to a degree of an electrostatic attractive force from a degree of beginning of molding/drying in a manner of the doctor blade method. Accordingly, the gap 30 has such structure that the conductive paste is likely to penetrate thereinto.

Furthermore, an edge of the green sheet 22 on a periphery 22a around the punching hole 26 tends to be shifted from an edge of the base film 24 because of the following reasons: the thermal expansion/shrinkage property of the base film 24 is slightly different from that of the green sheet 22 (the property is depending on the material characteristics), and the dry shrinkage of the green sheet 22 (it shrinks slightly even after being taken out from the drying kiln).

Then, the predetermined electrodes and the like (not shown) are printed on the green sheet 22, in accordance with such process as the screen printing process. In the process, such mucilagious conductive paste 28 is employed that contains conductive material being components of the electrode after firing the green sheet 28. For the conductive material, such material that contains the conductive ceramics, the metal particles and the like may be preferable. Then the conductive paste is applied to the green sheet in accordance with the process of the printing method.

For the conductive ceramic particles contained in the above-mentioned conductive paste, tungsten carbide or molybdenum carbide may be preferable because it is difficult for these materials to oxidize and it is difficult for the thermal conductivity to decline. For the metal particles, for example, one selected from a group consisted of tungsten, molybdenum, platinum, nickel, and the like, or more than two selected therefrom may be used. Mean particle size of these conductive ceramic particles and these metal particles may be within a range of 0.1 µm to 10 µm because of the filling in the through-hole and the printing process. As described below, a range of 1 µm to 5 µm may particularly be preferable because of easiness of penetration into a gap.

Suitable conductive paste is prepared by mixing and uniformly mulling 85 to 97 parts by weight of the conductive 17 component particles or the metal particles, 1.5 to 10 parts by weight of at least one binder selected from a group consisted of acrylic resin, ethyl cellulose, butylcellosorb and polyvinyl alcohol, 1.5 to 10 parts by weight of at least one solvent selected from a group consisted of α-terpineol, glycol, ethyl alcohol and butanol.

Viscosity of the conductive paste may preferably be within a range of 50000 to 500000 cps (50 to 500 Pa·s) because of easiness of penetration into the gap 30 formed at the periphery 22a around the through-hole 14.

As described above, adhesiveness between the green sheet 22 and the base film 24 at the beginning of the doctor blade method has already been lost; therefore the conductive material 28 in a paste form can penetrate into the gap 30 in a capillary action when being printed on the green sheet 22 in a process of the squeegee method and the roller method.

In this process, a viscosity of a conductive paste can be variable as described above. In addition to this, a width of penetration can be controlled by setting a pressure of a squeegee, a roller or the like. With controlling a viscosity of a conductive paste and a pressure of a squeegee or that of a roller or the like, an amount of a conductive paste filled in the through-hole 14 is slightly increased more than that of a prior art, then a conductive paste is caused to penetrate into the gap 30.

By performing the processes as above described, the conductive paste 28 is caused to penetrate into the gap 30, thereby the gap 30 being filled with the conductive paste 28 (FIG. 4(c)).

After that the base film 24 is peeled off from the green sheet 22; then each green sheet 22 is laminated in a correct order so that the predetermined laminated-green sheet body can be obtained; then each green sheet 22 is cut to be a predetermined shape to form a final shape as a molding product before sintering.

At this time, in accordance with a lamination order of a laminated body, the predetermined electrodes and the like are printed on each green sheet 22. The punching position is determined as such a position corresponding to each pattern, and the gap 30 is also formed on the corresponding position similarly. When each green sheet 22 is laminated then the punching hole 26 becomes the through-hole 14 and the conductive material 28 with which the gap 30 is filled becomes the projection 16 which projects from the through-hole 14 like a protrusion.

Thereafter, thus obtained green body may be inserted into a crucible or a setter and the like to decompose and degrease the binder and the like under a temperature of 350° C. to 600° C. for a predetermined period of time. Then the green body will be sintered at approximately 1800° C. for a predetermined period of time. Through those processes as described above, the desired sintered-substrate 12 made of aluminium nitride can be obtained, that has the conductive layer 18 (an electrode, a heating body and the like).

As described above, the manufacturing process according to the embodiment of the present invention allows the projection to be formed easily in a process of forming through-hole having the projection because there is no need to use an extra facility and/or a complex method. Although adjustment of punching condition is needed, there is no need to add a new process and/or an expensive parts or the like. Accordingly, cost can go down in the process of manufacturing a wafer prober.

Figure 5:
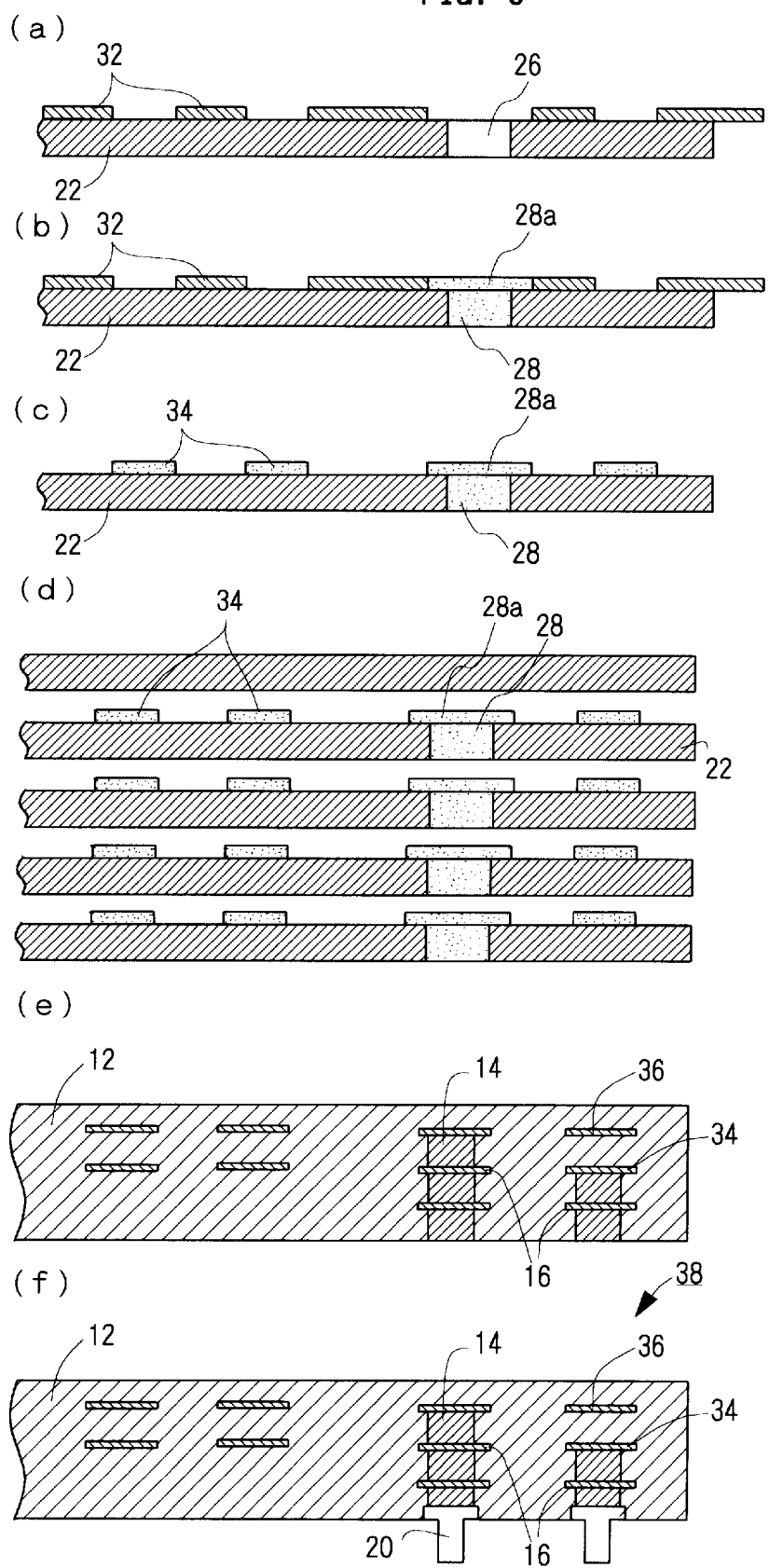
FIG. 5 shows processes of manufacturing the electrostatic chuck, according to one embodiment of the present invention.

Next, another manufacturing process of the preferred embodiment will be described hereinafter following the example of an electrostatic chuck with referring to FIG. 5. As described above, a hole is punched in the desired position on the green sheet 22 together with the base film 24 so that the through-hole 14 may be formed on the desired position of the green sheet 22 to which the base film 24 is adhered, thereby the punching hole 26 is formed as a cavity. On the green sheet 22, a metal mask 32 is placed that has an opening larger than the punching hole 26, then the punching hole 26 is filled with the conductive paste 28. One side of the through-hole 14 is shut at the time of filling; then when firing, a circle pattern 28a is printed, that becomes the projective part (the projection 16), on the side face of the through-hole 14.

Figure 6:
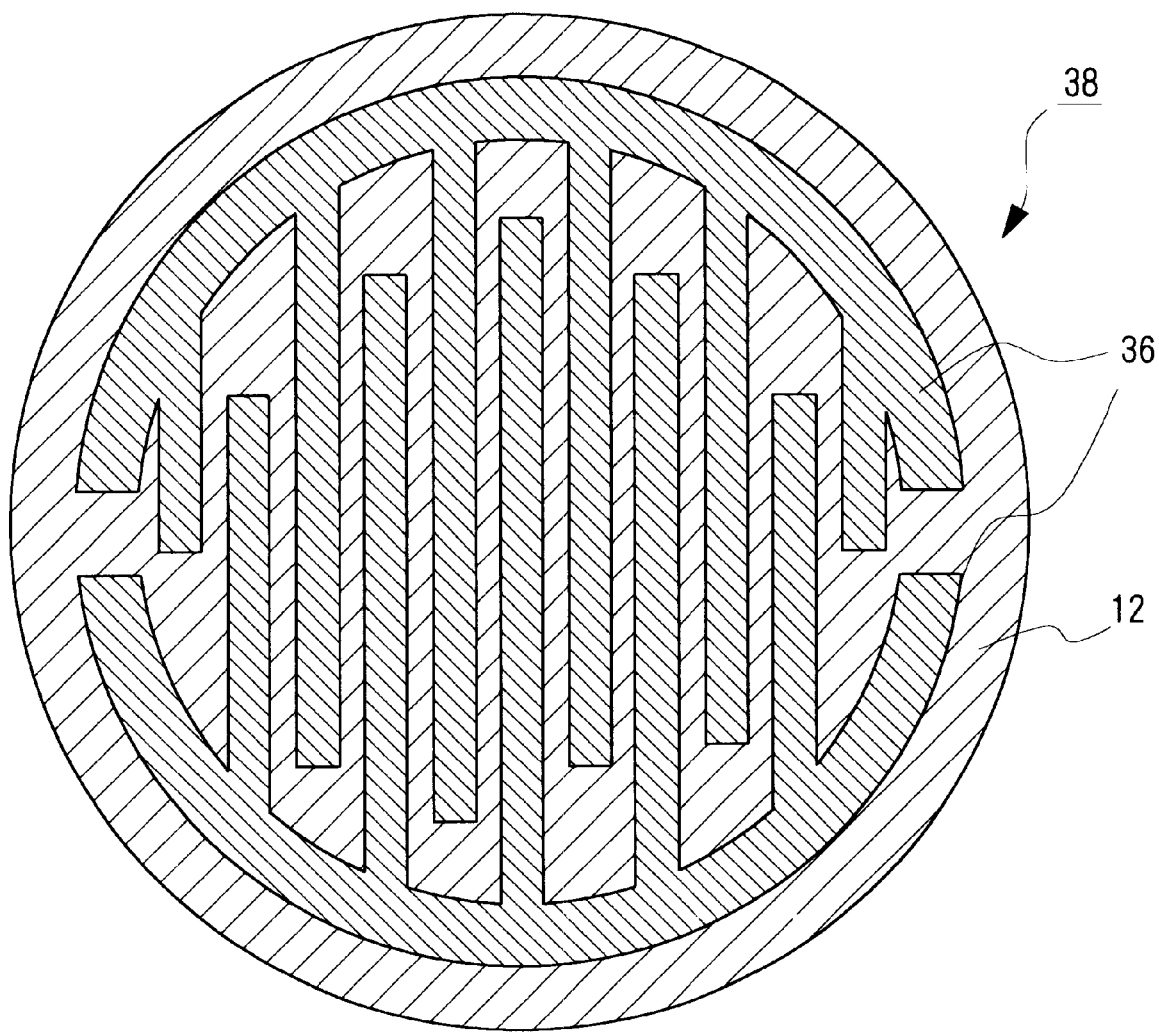
FIG. 6 is a view showing schematically the electrostatic electrode provided for the electrostatic chuck shown in FIG. 5.

On the green sheet 22, such pattern that forms a heat generation body 34 and an electrostatic electrode 36 is printed (in FIG. 6, a plane view of the electrostatic electrode 36 is shown, in other words, a sectional view of the electrostatic electrode 36 in FIGS. 5(e) and (f)).

Although some examples carrying out the present invention will be disclosed hereinbelow, it should be understood that the present invention is not to be limited thereto.

EXAMPLE 1

A Wafer Prober With a Heater

Firstly, a ceramic paste composition was made by mixing 100 parts by weight of powdered aluminium nitride (available from Tokuyama Corp., a mean particle diameter 1.1 µm), 4 parts by weight of yttrium (a mean particle diameter 0.4 µm), 11.5 parts by weight of acrylic binder, 0.5 parts by weight of dispersant, and 53 parts by weight of alcohol mixture containing 1-butanol and ethanol. By means of the doctor blade method, the sheet formation was made from the paste on a base film comprised of PET, or the like, to obtain a green sheet having a thickness of 0.47 mm.

Thus prepared green sheet was dried at 80° C. for five hours, the openings for making through-holes were punched out in the predetermined positions on the green sheet. Every time when the punch was sprung up, the gap was formed between the green sheet and PET.

Conductive paste for use in the through-hole was prepared by mixing 100 parts by weight of tungsten carbide having a mean particle diameter of 3 µm, 1.9 parts by weight of acrylic binder, 3.7 parts by weight of α-terpineol solvent, and 0.2 parts by weight of dispersant.

Next, a pattern of the electrodes and the heat generation body are printed and formed on the green sheet by using a method of a prior art. Then the openings for the through-holes and the gap parts were filled with the conductive paste for a through-hole.

Then fifty sheets the prepared green sheet, with the electrodes patterns, or the like, being printed thereon and the openings for the through-hole being filled with the conductive paste, were laminated and bonded with a pressure of 130 kg/cm², to integrate to produce a green sheet laminated body.

Figure 7:
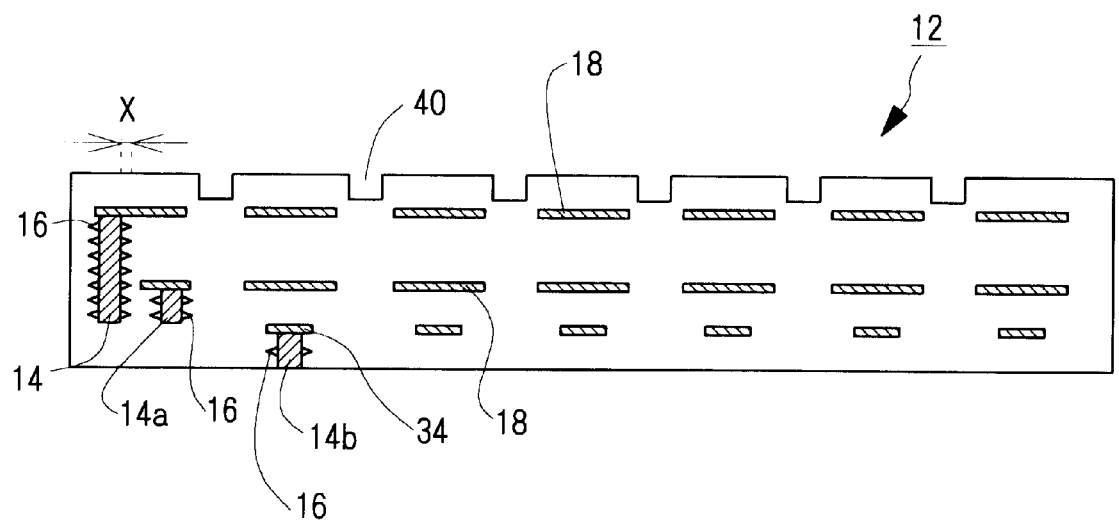
FIG. 7 is a view showing a cross sectional structure of the ceramic substrate, according to one embodiment of the present invention.

Thus obtained green sheet laminated body was degreased at approximately 600° C. for three hours under nitrogen environment, then was hot-pressed at approximately 1890° C. under a pressure of 150 kg/cm² for three hours to obtain the ceramic substrate 12 in the form of an aluminium nitride plate with thickness of 4 mm. Thus obtained ceramic substrate 12 was cut to a disk having a diameter of 230 mm (see FIG. 7).

The through-holes 14 and 14a had a diameter both of 3.0 mm, and a depth of 6.0 mm and 3.0 mm respectively; a size X of a brim of the projection 16 was 100 µm. Similar to a prior art, a surface on the ceramic substrate 12 was provided with a recess for a thermocouple (not shown) and a groove 40 for sucking a silicon wafer.

Figure 8:
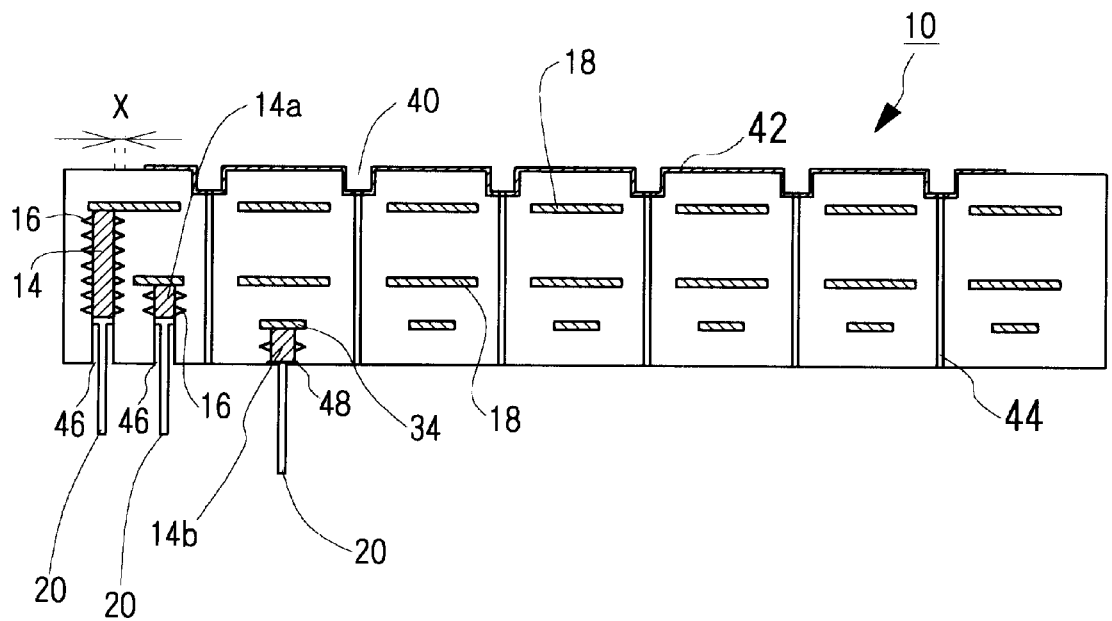
FIG. 8 is a view showing a cross sectional structure of the wafer prober which utilizes the ceramic substrate shown in FIG. 7, according to one embodiment of the present invention.

Then titanium, molybdenum and nickel layers were formed on the surface on which the grooves 40 were formed. Furthermore, on the obtained layers, a nickel layer containing a boron content of 1% by weight or less was caused to deposit by using an electroless nickel plating bath and an electrolytic nickel plating bath; after that it was annealed. Furthermore, a gold plating layer was formed thereon by an electroless gold plating bath to produce a chuck top conductor layer 42 (see FIG. 8).

Figure 9:
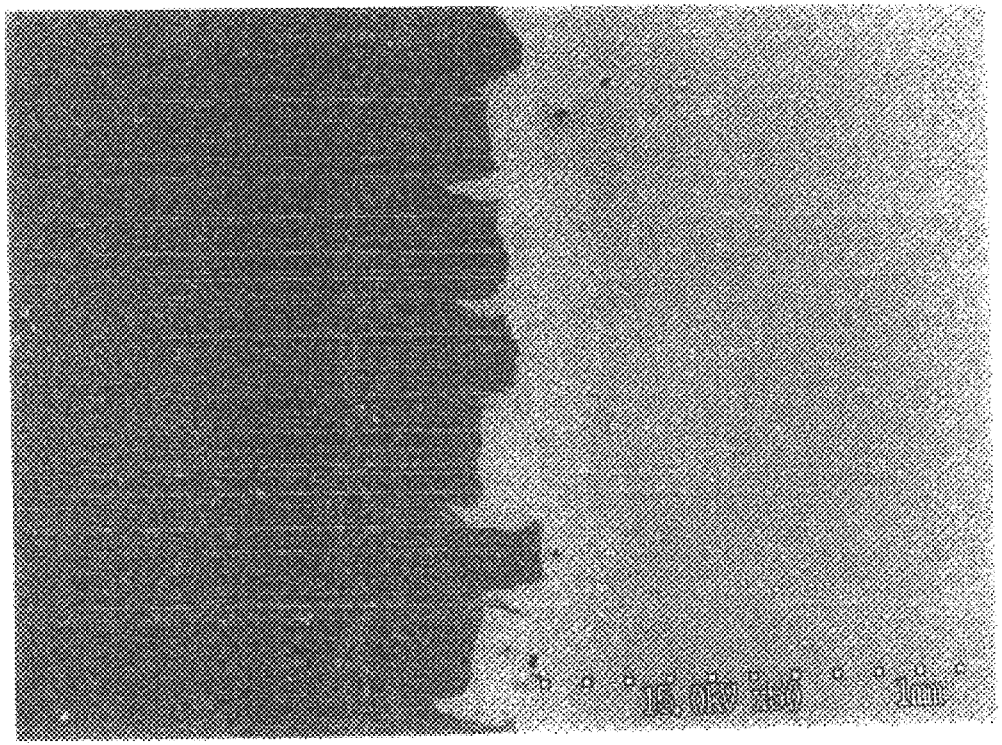
FIG. 9 is a picture, in substitute for a drawing, which shows a cross section of a through-hole of a wafer prober with a heater, according to Example 1.

FIG. 9 is a picture showing a through-hole of a wafer prober with a heater consistent with Example 1. As shown in FIG. 9, a plurality of projections is formed on the side face of the through-hole.

Then an air suction hole 44 penetrating from the groove 40 toward the rear face was drilled; furthermore, a blind hole 46 for exposing the through-holes 14, 14a and 14b were formed. The external terminal pin 20 made of Kovar was connected to the blind hole 46 by using a gold flux comprising an Ni—Au alloy (Au of 81.5% by weight, Ni of 18.4% by weight, impurity of 0.1% by weight) by applying reflow under heating at 970° C. In similar manner, the external terminal pin 20 made of Kovar was connected to the heat generation body 34 through a solder layer 48 (see FIG. 8).

EXAMPLE 2

An Electrostatic Chuck With a Heater (1) A paste was made by mixing 100 parts by weight of powdered aluminium nitride, 4 parts by weight of yttrium (a mean particle diameter 0.4 µm), 11.5 parts by weight of acrylic binder, 0.5 part by weight of dispersant, and 53 parts by weight of alcohol mixture containing 1-butanol and ethanol. By means of the doctor blade method, the sheet formation was made from the paste to obtain a green sheet having a thickness of 0.47 mm.

(2) Thus prepared green sheet was dried at 80° C. for five hours. After that the passing through-holes 44 having a diameter of 3.0 mm, being used for inserting a pin for supporting a semiconductor wafer were formed by way of punching; and the through-holes 14 for connection with the external pin having a diameter of 5.0 mm were formed by way of punching.

(3) Conductive paste A was prepared by mixing 100 parts by weight of tungsten carbide having a mean particle diameter of 1 µm, 3.0 parts by weight of acrylic binder, 3.5 parts by weight of α-terpineol solvent, and 0.3 parts by weight of dispersant. Conductive paste B was prepared by mixing 100 parts by weight of tungsten carbide having a mean particle diameter of 3 µm, 1.9 parts by weight of acrylic binder, 3.7 parts by weight of α-terpineol solvent, and 0.2 parts by weight of dispersant.

The conductive paste A was printed on the green sheet by the screen printing process to produce a conductive paste layer. A print pattern was defined as a concentric circle. Furthermore, a conductive paste made of an electrostatic electrodes having a shape of a comb parts, shown in FIG. 6, was formed on another green sheet. Furthermore, the metal mask 32 made of stainless steel having a diameter of 5.1 mm was disposed on the green sheet as shown in FIG. 5(a); then a passing through-hole for the through-hole for connection with an external pin was filled with the conductive paste B and a circle pattern was printed thereon to produce a projective parts (FIG. 5(b)).

Further, the green sheets with no tungsten paste being printed (FIG. 5(c)) were laminated by thirty seven sheets on the upper side (heating surface) and by thirteen sheets on the lower side of the obtained laminated body, at 130° C. under a pressure of 80 kg/cm² (FIG. 5(d)).

(4) Then, thus obtained laminated-body was degreased in nitrogen gas at 600° C. for five hours, and was hot-pressed at 189° C. under a pressure of 150 kg/cm² for three hours to obtain an aluminum nitride plate of 3 mm thickness. A disk of 230 mm was cut-out from the plate to prepare a ceramic plate having a heat generation body of 6 µm thickness and 10 mm width, an electrostatic electrode, and a through-hole in inside (FIG. 5(e)).

(5) Next, the plate obtained in above mentioned (4) was ground with using a diamond grind stone; then a mask was disposed thereon; and then a hole with a bottom (1.2 mm of a diameter, and 2.0 mm of a depth) was formed on the obtained plate by way of an abrasive blasting process with using a glass beads.

(6) Furthermore, a portion of the passing through-hole for use as the through-hole was scraped to form a recess, and an external terminal pin made of Kovar was connected to the recess by using a gold flux comprising a Ni—Au alloy and reflowing under heating at 700° C. (FIG. 5(f)). Connection with the external terminal pin may preferably have such structure as to be supported at three points by a tungsten support. Because reliability of connection can be ensured.

(8) Then, a plurality of thermocouples for controlling temperature were buried in recesses to complete manufacture for the electrostatic chuck.

COMPARATIVE EXAMPLE 1

No Projection

Similar to Example 1, the green sheet was dried at 80° C. for five hours; then the passing through-hole for the through-hole was formed by making an openings by way of drilling, but no gap was produced between PET and the green sheet. On the obtained through-hole, no projection is formed.
Evaluation With respect to the wafer prober and the electrostatic chuck, specimens in Examples and Comparative examples were subjected to measure a fracture strength by pulling an external lug under a speed of 0.5 m/second, by means of an autograph (an autograph AGS-G available from Shimazu Corp.). Furthermore, a wafer-placed plane in each specimen were heated up to a temperature of 400° C.; then a portion just above the through-hole and other portions were subjected to measure a temperature difference therebetween with a thermo-viewer.

There are shown the results in Table 1.

TABLE 1

|  | Fracture strength (kgf/cm$^2$) | Temperature difference (° C.) |
|---|---|---|
| Example 1 | 20 | 5 |
| Example 2 | 18 | 5 |
| Comparative example 1 | 10 | 10 |

With respect to a fracture strength causing each ceramic substrate to be broken, due to a drawing stress applied to the through-hole, it is understood that from the results, each strength of Examples is higher than that of Comparative example. With respect to a temperature difference, each Example shows a lower value than the Comparative example.

Figure 10:
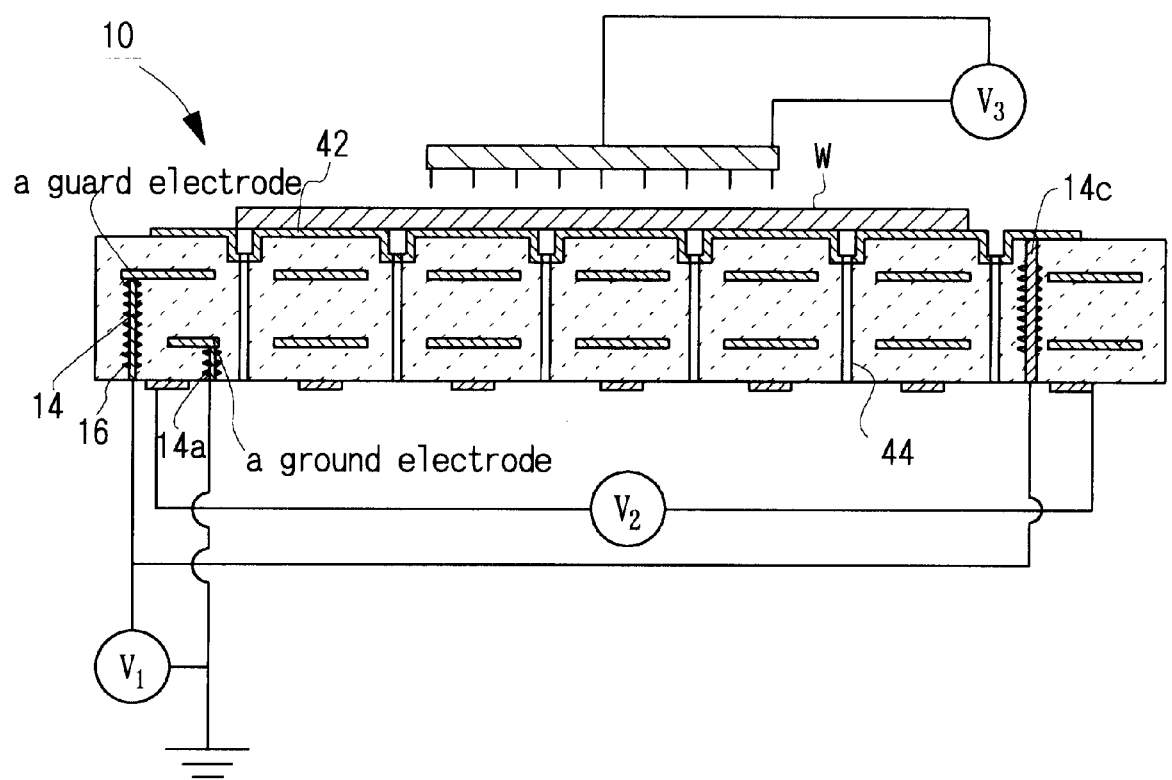
FIG. 10 is a view showing schematic constitution of the wafer prober, according to one embodiment of the present invention.
Figure 11:
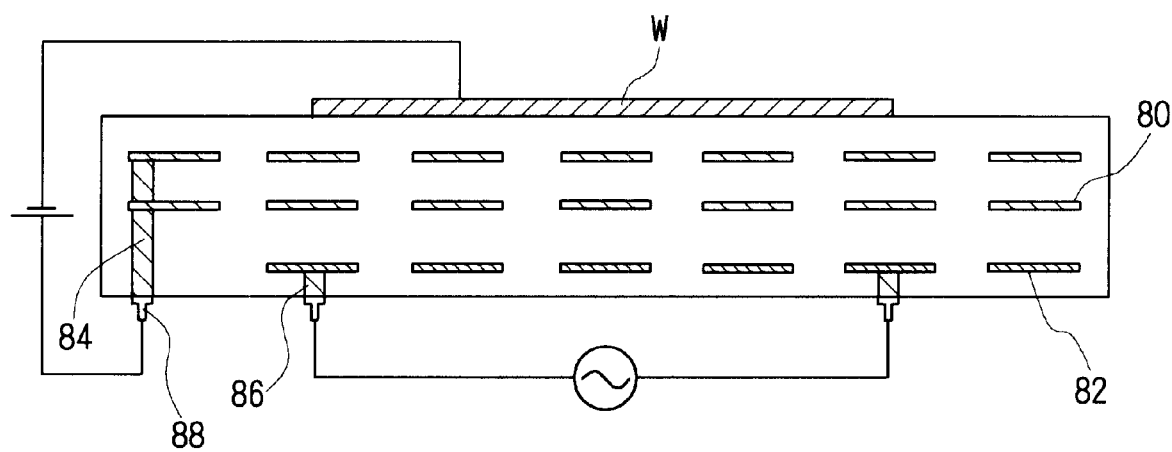
FIG. 11 is a view showing a sectional structure of the ceramic substrate having a conventional through-hole, and is an electrostatic chuck as an example.

Additionally, the present invention is not limited to the above-mentioned embodiment. For example, as shown in FIG. 10, the wafer prober may be provided with, not only the through-hole 14c for connecting electrically to the chuck top conductive layer, but also the through-holes 14, 14a for connecting electrically to a guard electrode and a ground electrode. Furthermore, a side face on the through-hole for connecting to the guard and ground electrodes may be provided with the projection 16 (a portion of a protrusion).

Furthermore, although above-mentioned preferred embodiment is such that the projection is provided for the through-hole, alternatively, a recess may be provided for the through-hole. In brief, concerning the through-hole's structure of the ceramic substrate for use in a manufacturing device and an inspection device, the concept of the present invention may be achieved provided that the through-hole is strongly adhered to the ceramic substrate; and that uniformity of whole temperature is achieved.

The ceramic substrate according to claims 1 to 4 consistent with the present invention allows the through-hole structure to have excellent tolerance against a drawing stress applied to an external terminal pin, and to have excellent reliability performance. Furthermore, it is difficult to cause a hot spot to be formed, thereby achieving uniform distribution of temperatures. According to the present invention, an electrostatic chuck, a wafer prober and a heater that have above-mentioned through hole structure can be manufactured easily. These products achieve high reliability performance against a drawing stress applied to an external terminal pin and further achieve uniform distribution of the temperatures.

The foregoing description of the preferred embodiments of the invention has been presented for purposes of illustration and description. It is not intended to be exhaustive or to limit the invention to the precise form disclosed, and modifications and variations are possible in the light of the above teachings or may be acquired from practice of the invention. The embodiments chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A ceramic heater for use in the manufacture and inspection processes of semiconductors, comprising:
   a circular ceramic substrate;
   a heat-generation pattern inside said circular ceramic substrate; and
   at least one conductive through-hole connected electrically to said heat-generation pattern, wherein at least one projection is formed on a side wall of each of the at least one conductive through-hole so as to protrude into said circular ceramic substrate, and a heating surface for a wafer is existent on the through-hole.

2. The ceramic heater for use in the manufacture and inspection processes of semiconductors, according to claim 1, further comprising: an electrostatic electrode disposed within the circular ceramic substrate.

3. The ceramic heater for use in the manufacture and inspection processes of semiconductors, according to claim 1, wherein said circular ceramic substrate is made of one selected from the group consisting of nitride ceramics, carbide ceramics, and oxide ceramics.

4. The ceramic heater for use in manufacture or inspection processes of semiconductors, according to claim 1, wherein said at least one projection has a shape of a brim or a bamboo joint.

* * * * *

UNITED STATES PATENT AND TRADEMARK OFFICE
CERTIFICATE OF CORRECTION

PATENT NO. : 6,632,512 B1 Page 1 of 1
DATED : October 14, 2003
INVENTOR(S) : Yasutaka Ito It is certified that error appears in the above-identified patent and that said Letters Patent is hereby corrected as shown below:

Column 12,
Line 21, please replace claim 1 with the following:
1. A ceramic heater for use in the manufacture and inspection processes of semiconductors, comprising:

a circular ceramic substrate;

a heat-generation pattern inside said circular ceramic substrate; and at least one conductive through-hole connected electrically to said heat-generation pattern, wherein at least one projection is formed on a side wall of each of the at least one conductive through-hole so as to protrude into said circular ceramic substrate, wherein said at least one prejection has a size within a range of 50 $\mu$m to 0.5 mm and a heating surface for a wafer is existent on the through-hole.

Signed and Sealed this

Ninth Day of March, 2004

JON W. DUDAS
*Acting Director of the United States Patent and Trademark Office*